United States Patent [19]

Yeh et al.

[11] Patent Number: 4,961,101

[45] Date of Patent: Oct. 2, 1990

[54] SEMICONDUCTOR MOSFET DEVICE WITH OFFSET REGIONS

[75] Inventors: Ching Fa Yeh; Yuji Yatsuda, both of Kanagawa, Japan

[73] Assignee: Fuji Xerox Co., Ltd., Tokyo, Japan

[21] Appl. No.: 183,847

[22] Filed: Apr. 20, 1988

[30] Foreign Application Priority Data

Apr. 21, 1987 [JP] Japan .................................. 62-98109

[51] Int. Cl.[5] .............................................. H01L 27/12

[52] U.S. Cl. .................................. 357/49; 357/23.11; 357/45; 357/23.8; 357/23.4; 357/59

[58] Field of Search ............... 357/49, 47, 23.11, 23.8, 357/23.4, 45, 20, 59 G

[56] References Cited

U.S. PATENT DOCUMENTS

| | | | |
|---|---|---|---|
| 4,599,576 | 7/1986 | Yoshida et al. | 357/23.8 X |
| 4,603,341 | 7/1986 | Bertin et al. | 357/45 X |
| 4,721,990 | 1/1988 | Kinoshita | 357/23.8 X |
| 4,748,489 | 5/1988 | Komatsu | 357/23.8 X |
| 4,774,560 | 9/1988 | Coe | 357/23.8 X |

FOREIGN PATENT DOCUMENTS

| | | | |
|---|---|---|---|
| 0526086 | 1/1977 | Japan | 357/23.11 |
| 57-211778 | 12/1982 | Japan | 357/23.8 |

*Primary Examiner*—William Mintel
*Attorney, Agent, or Firm*—Spensley Horn Jubas & Lubitz

[57] ABSTRACT

In a semiconductor device comprising a plurality of planar high-voltage insulated-gate field-effect transistors in which offset regions are provided in portions of the semiconductor substrate near the junctions of adjacent drain regions and near the substrate surface additional, low impurity concentration offset regions are formed in the semiconductor substrate in such a manner that each low impurity concentration offset region is coupled to a source region and is located between the drain regions of the field-effect transistors adjacent to each other and near the semiconductor surface, whereby reduction of the "on resistance" is achieved without affecting the FET sustaining voltage.

5 Claims, 4 Drawing Sheets

SEMICONDUCTOR MOSFET DEVICE WITH OFFSET REGIONS

BACKGROUND OF THE INVENTION

This invention relates to insulated gate field-effect transistors (hereinafter referred to as "MOS FETs", when applicable), and more particularly to the structure of a semiconductor device including high voltage high current MOS FETs which can be effectively employed for integrated circuits.

With progress of the technique of semiconductor, manufacture integrated circuits have been improved in the degree of integration and in miniaturization, while formation of ordinary logic circuit MOS FET and high voltage MOS FETs on one and the same substrate has been tried. As a result, the development of high voltage MOS FETs has made remarkable progress.

High voltage MOS FETs should be formed especially with the following three phenomena taken into consideration:

(1) Punch-through between the source and the drain;

(2) Dielectric breakdown between the gate electrode and the drain region; and p (3) Avalanche caused by the electric field being concentrated near the junction of the drain region.

In order to eliminate these difficulties, a variety of methods have been proposed in the art. Among these methods, the following method is most effective: In the vicinity of the gate electrode where electric lines of force are likely to be concentrated under voltage application, offset regions low in impurity concentration are provided near the junctions of the source and drain regions so that the gate electrode is sufficiently spaced from the regions for prevention of dielectric breakdown, and in the vicinity of the surface thereof the electric field strength of the junction is released.

This offset structure is, in general, a so-called "both offset structure" in which two offset regions are provided for the source region and the drain region, respectively. A method of forming high voltage MOS FETs withstanding several tens of volts and ordinary logic circuit MOS FETs on one and the same substrate without changing the manufacturing steps has been proposed in Japanese Pat. application No. 174030/1986.

One example of the method will be described with reference to FIGS. 5(*a*) and 5(*b*). FIG. 5(*a*) is a plan view showing a part of a both offset structure high voltage MOS FETs pattern, and FIG. 5(*b*) is a sectional view taken along line C—C' in FIG. 5(*a*).

As shown in FIGS. 5(*a*) and 5(*b*), a MOS FET 50 comprises: an N+ type source region 52 and an N+ type drain region 53 which are formed in a P type semiconductor substrate 51; and a gate electrode 55 formed on a gate insulation film 54. In the MOS FET 50, insulation films 56 and 56' are formed between the gate insulation film 54 and the source region 52 and the drain region 53 by the LOCOS (local oxidation of silicon) method (hereinafter referred to as "LOCOS insulation films", when applicable) and offset regions 57 and 57' are formed below the LOCOS insulation films 56 and 56', respectively. The offset regions are equal in conductivity type to the source and drain regions and are low in impurity concentration. In FIG. 5(*a*), the LOCOS insulation films 56 and 56' are not shown, and reference numerals 59 and 61 designate a source electrode and a drain electrode, respectively.

The provision of the LOCOS insulation films 56 and 56' and the offset regions 57 and 57' makes it possible to increase the distance between the source region and the drain region, to reduce the effect of the electric field which is liable to concentrate in the surface of the semiconductor substrate near the junctions of the two regions and the gate electrode 55, and to increase the sustaining voltage of the FET.

The LOCOS insulation films and the offset regions can be formed in nearly the same manufacturing steps as separating LOCOS insulating films and low impurity concentration layers as channel stoppers, respectively in the ordinary logic circuit MOS FETs; that is, they can be formed without increasing the number of manufacturing steps.

On the other hand, in order to increase the degree of integration in integrated circuits, it is essential to increase MOS FET sustaining voltage, and to permit, for instance in the case where a high voltage MOS FET pattern is formed, a current as large as possible to flow in a small area.

For this purpose, it is necessary to reduce an "on resistance ($R_{ON}$)" while maintaining the sustaining voltage of the FET unchanged. The "on resistance ($R_{ON}$)" as used herein is intended to mean the resistance between the source and drain regions provided when the MOS FET is rendered conductive. The "on resistance ($R_{ON}$)" of the high voltage MOS FET consists of a channel resistance and an offset region resistance. The channel resistance is determined from the dimensions of the MOS FET; i.e., the length and width of the channel region, and the threshold voltage; that is, it is substantially impossible to change the channel resistance. On the other hand, the offset region resistance depends on the size and the impurity concentration of the offset region; however, in order to maintain the sustaining voltage unchanged, the impurity concentration should not be increased so much.

SUMMARY OF THE INVENTION

Accordingly, an object of this invention is to provide a MOS FET structure which, in a high voltage MOS FET pattern, reduces the "on resistance" without affecting the sustaining voltage, thereby to allow large current to flow therein.

The foregoing object and other objects of the invention have been achieved by the provision of a semiconductor device comprising a plurality of planar high-voltage insulated-gate field-effect transistors in which offset regions are provided near the junctions of drain regions with a semiconductor substrate and near the surface of the semiconductor substrate; which, according to the invention, comprises: low impurity concentration offset regions coupled to source regions, each being formed in at least one part of the semiconductor substrate near the surface between the drain regions of said field-effect transistors adjacent to each other.

When, for instance in an integrated circuit, an N channel MOS FET is rendered conductive, reverse bias is generally applied to the drain region; however, in this case the source region is grounded, and therefore voltage is scarcely applied to the source region. Accordingly, in operation, the electric field is concentrated between the drain region and the gate electrode. Therefore, in the invention, the offset region on the source region side is eliminated, and a single offset structure is employed.

Furthermore, in the case of forming a MOS FET pattern in which a number of single offset structure MOS FETs are juxtaposed, an offset region coupled to the source region is provided between the drain regions of the FETs adjacent to each other; that is, a double offset structure is partially employed. As a result, the MOS FET pattern is free from the difficulty that, when single offset structure MOS FETs are juxtaposed, the channel layer is not substantially formed in the surface of the semiconductor substrate below the gate electrode located between the drain regions of the FETs adjacent to each other and no drain current flows therein. That is, in the MOS FET pattern formed, the channel layer acts effectively to allow large current to flow therein.

The nature, principle and utility of the invention will become more apparent from the following detailed description when read in conjunction with the accompanying drawings.

DETAILED DESCRIPTION OF THE PREFERRED EMBODIMENT

One preferred embodiment of the invention will be described with reference to FIGS. 1(*a*) through 4.

Figure 3A:
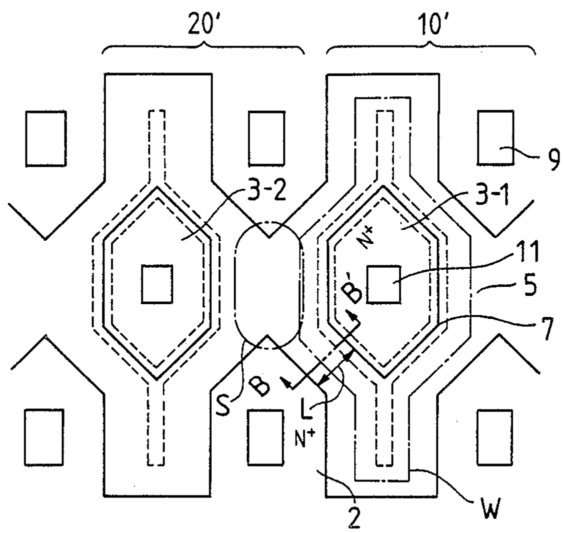
FIGS. 3(*a*) and 3(*b*) are explanatory diagrams showing a single offset structure MOS FET.
Figure 3B:
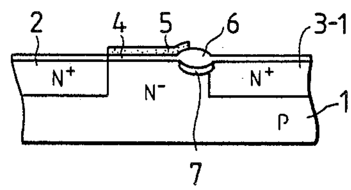

FIG. 3(*a*) is a partial plan view of a MOS FET pattern with a single offset structure. FIG. 3(*b*) is a sectional view taken along the line B—B' in FIG. 3(*a*). As shown in FIGS. 3(*a*) and 3(*b*), a MOS FET comprises: an $N^+$ type source region 2 and an $N^+$ type drain region 3—1 which are formed on a P type semiconductor substrate 1; a gate insulation film 4; and a gate electrode 5. In the MOS FET, a LOCOS insulation film 6 is formed only in the junction surface of the drain region 3—1 near the gate insulation film 4, and an $N^-$ type offset region 7 is formed under the LOCOS insulation film 6. Neither of the LOCOS insulation film and offset region is formed on the source region side.

Figure 4:
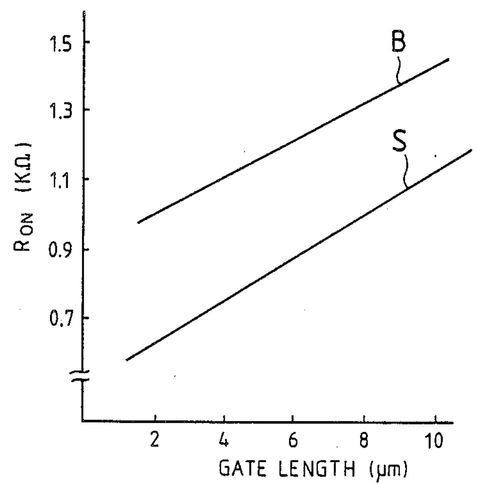
FIG. 4 is a graphical representation for comparison of a single offset structure MOS FET with a double offset structure MOS FET in their characteristics.
Figure 5A:
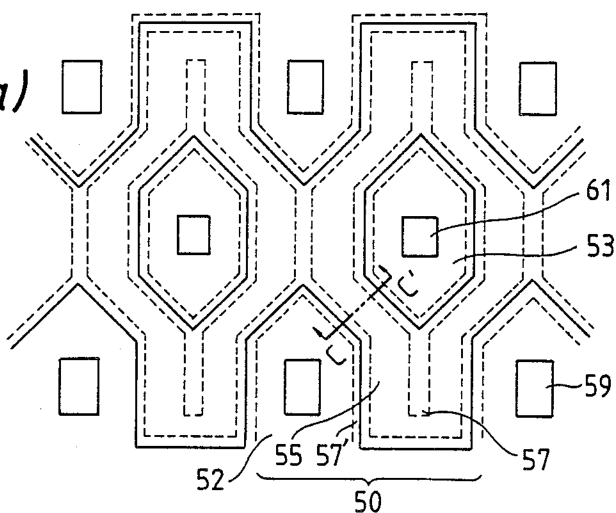
FIGS. 5(*a*) and 5(*b*) are explanatory diagrams for a description of the structure of a conventional high voltage MOS FET.
Figure 5B:
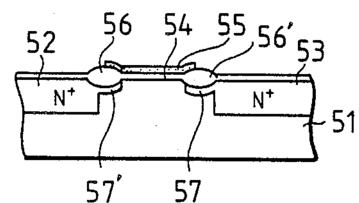

In this structure, unlike the conventional structure in which the resistance attributes to two offset regions, the resistance attributes to only one offset region, and accordingly the "on resistance" is greatly reduced. FIG. 4 shows the "on resistance ($R_{ON}$) S" in the case of a single offset structure and the "on resistance" ($R_{ON}$) B in the case of a double offset structure. As is apparent from FIG. 4, the "on resistance" of the single offset structure is much smaller than that of the double offset structure.

On the other hand, in the single offset structure MOS FET pattern, the P type semiconductor substrate is provided below the gate electrode, and therefore current scarcely flows in the semiconductor substrate surface part S shown in FIG. 3(*a*), for instance, between the $N^+$ type drain regions 3—1 and 3—2 of the MOS FETs 10' and 20' even if the MOS FETs are rendered conductive. This is because, in a FET, the drain current ID is, in general, proportional to the width W of a channel region formed below the gate electrode between the source and drain regions (length of a dash and dotted line W around the region 3—1 in FIG. 3(*a*)), and is inversely proportional to the length L (see FIG. 3(*a*)) of the channel layer. In the structure shown in FIG. 3(*a*), in the semiconductor substrate surface part S, the length of the channel layer being considerably large, it is substantially difficult for current to flow in the part S.

In order to eliminate this difficulty, the embodiment of the invention employs a partial double offset structure in which, between the adjacent drain regions of single offset structure MOS FETs juxtaposed, an offset region extended from the source region is provided.

The partial double offset structure will be described with reference to FIGS. 1(*a*) to 1(*c*). FIG. 1(*a*) is a plan view showing a part of a high voltage MOS FET pattern with partial double offset regions; FIG. 1(*b*) is a sectional view taken along the line A—A' in FIG. 1(*a*), and FIG. 1(*c*) is a plan view showing a partial double offset structure high voltage high current MOS FET pattern.

Figure 1A:
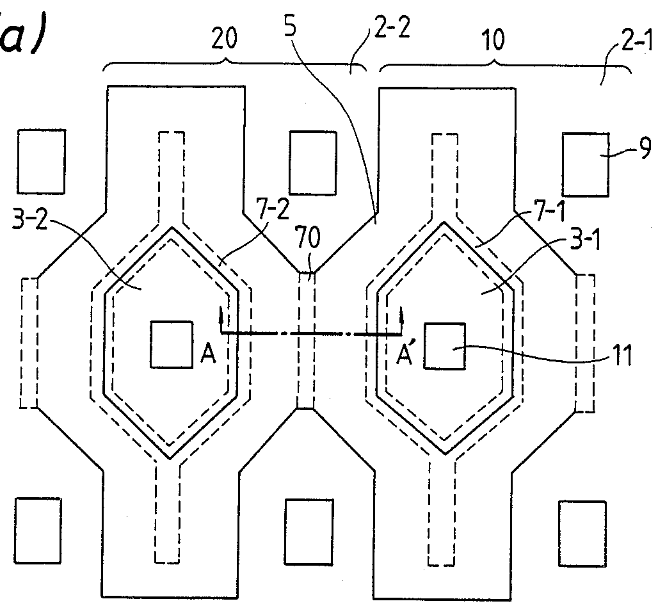
FIGS. 1(*a*) to 1(*c*) are explanatory diagrams showing a partial double offset structure MOS FET pattern which is one embodiment of this invention.
Figure 1B:
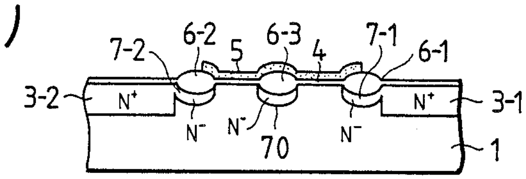
Figure 1C:
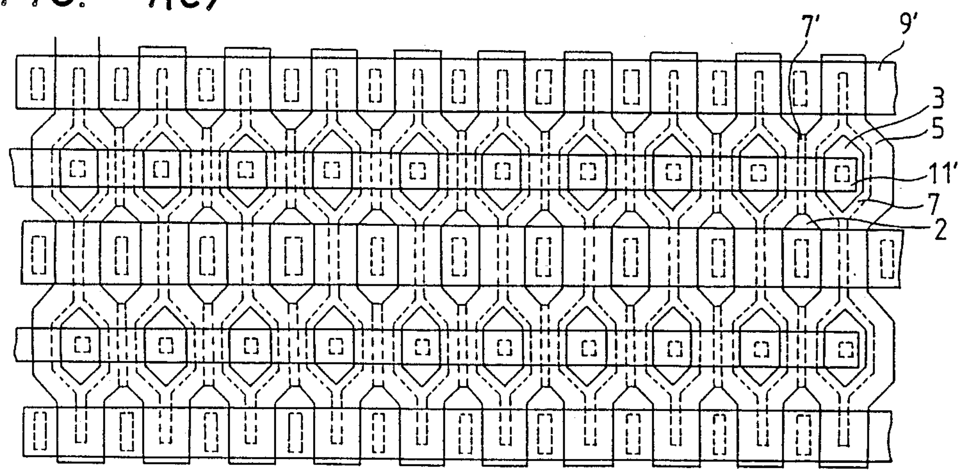
Figure 2A:
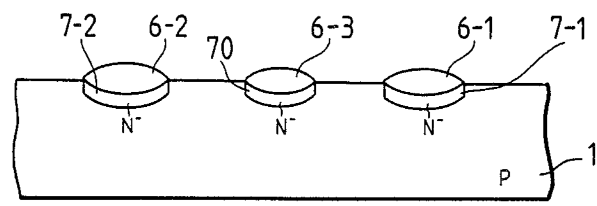
FIGS. 2(*a*) to 2(*e*) are explanatory diagrams for a description of the manufacture of the MOS FET pattern shown in FIGS. 1(*a*) to 1(*c*)
Figure 2B:
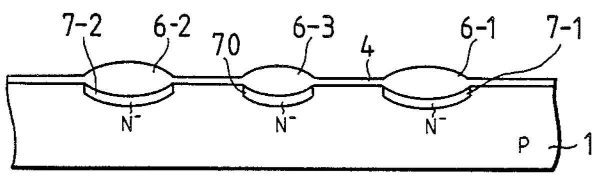
Figure 2C:
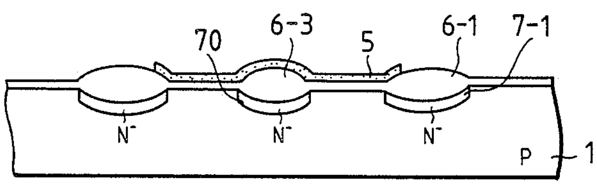
Figure 2D:
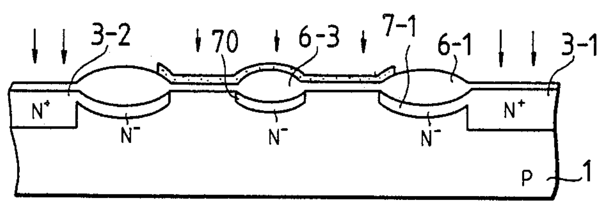
Figure 2E:
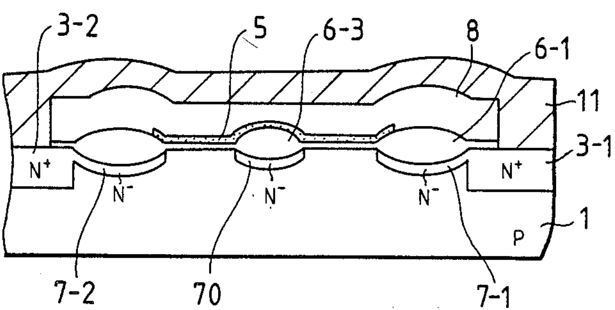

As shown in FIGS. 1(*a*) to 1(*c*), in a part of the surface of a P type semiconductor substrate 1 below a gate electrode 5 which is formed between the $N^+$ type drain region 3—1 of a MOS FET 10 and the $N^+$ type drain region 3—2 of a MOS FET 20 adjacent to the MOS FET 10, offset regions for the drains and an $N^-$ type offset region 70 in contact with an $N^+$ type source region 2—2 are simultaneously formed. In this structure, a channel layer is substantially formed in the part S in FIG. 3(*a*), thus permitting current to flow in that part.

As best seen in FIG. 1(*c*), the source regions 2 are arranged in an orthogonal array with the drain regions 3 interleaved in a similar orthogonal array. The gate electrode 5 overlies the offset regions 7 surrounding each drain region 3 and interconnecting adjacent drain regions 3. The second set of offset regions 7' interconnect adjacent source regions 2. Source electrodes 9' interconnect the source regions 2 and drain electrodes 11 interconnect the drain regions 3.

A method of manufacturing the MOS FET pattern according to the invention will be described with reference to FIGS. 2(*a*) to 2(*e*) which correspond to FIG. 1(*b*).

For instance, phosphorus (P) is implanted in predetermined parts of the P type semiconductor substrate 1; i.e., in the regions (indicated at 7—1 and 7—2 in FIG. 1(*a*) surrounding the drain regions and the offset region of the invention (indicated at 70) by the conventional selective ion implantation method, to form offset regions 7—1, 7—2 and 70. Thereafter, LOCOS insulation films 6—1, 6—2 and 6—3 are formed on the offset regions 7—1, 7—2 and 70 by the ordinary LOCOS method, respectively (shown in FIG. 2(*a*)).

Under this condition, a gate oxide film 4 is formed by oxidizing the surface of the semiconductor substrate 1 (FIG. 2(*b*)).

A polysilicon layer phosphorus-doped with high concentration is formed on the semiconductor substrate 1 thus treated, according to the conventional method, and patterned as required, to form gate electrodes 5. That is, the gate electrodes 5 are made of the polysilicon layer. In this connection, the pattern of the gate electrodes is so designed that the gate electrodes surround the LOCOS oxide films 6—1, 6—2 and 6—3 formed respectively on the offset regions 7—1, 7—2 and 70 and they are joined together (FIG. 1(*a*)). Accordingly, the partial offset region 70 in contact with the source region is positioned below the gate electrode 5 (FIG. 2(*c*)).

Under this condition, arsenic (As) or phosphorus (P) is implanted in the entire surface of the semiconductor substrate 1 with high concentration. In this operation, selective impurity implantation is carried out in self-alignment manner with the LOCOS oxide films 6—1 and 6—2 over the offset regions as masks on the drain region sides and with the gate electrode as a mask on the source region side, as a result of which N+ type drain regions 3—1 and 3—2 and a source region (not shown) are formed (FIG. 2(*d*)).

Thereafter, as shown in FIG. 2(*e*), a silicon glass film (BPSG film) containing boron (B) and phosphorus (P), namely, an inter-layer insulation film 8 is formed with a usual CVD method. Contact holes are formed in predetermined parts of the source and drain regions, and a source electrode 12 and a drain electrode 11 are formed of aluminum therein, and a wiring pattern and a protective film are formed thereon. Thus, the desired semiconductor device aimed has been manufactured (FIG. 2(*e*)).

In the above-described embodiment, only the high voltage N channel MOS FETs are formed on one and the same substrate; however, it should be noted that the invention is not limited thereto or thereby. That is, the technical concept of the invention is applicable to the case where high voltage MOS FETs and ordinary logic circuit MOS FETs are formed on one and the same substrate. In this case, a mask pattern for forming the offset regions and a mask pattern for a low impurity concentration layer serving as channel stoppers for the ordinary logic circuit MOS FETs can be formed in the same manufacturing step. It goes without saying that the LOCOS insulation film can be formed in the same manufacturing step in the cases of the high voltage FETs and the ordinary logic circuit FETs.

As is apparent from the above description, according to the invention, the offset region provided on the source region side of the high voltage MOS FET is eliminated, whereby when the high voltage MOS FET is rendered conductive, the "on resistance" between the source and drain regions is greatly reduced and the sustaining voltage can be maintained substantially unchanged to permit the flow of current, and furthermore the device area can be reduced as much as the offset region, which will contribute to the improvement of the degree of integration of integrated circuits.

In the high voltage MOS FET pattern in which the high voltage MOS FETs are juxtaposed, according to the invention the offset region 70 connected to the source region is provided between the drain regions of adjacent MOS FETs, and therefore the channel is substantially formed also in the region, whereby current allowed to flow in the high voltage MOS FET pattern is larger than in the conventional one.

What is claimed is:

1. A semiconductor device including a plurality of planar high-voltage insulated-gate FETs, said FETs comprising:
- a semiconductor substrate;
- a plurality of drain regions disposed in said substrate and having a first impurity concentration level;
- a plurality of source regions disposed in said substrate, each source region being adjacent to but spaced from an associated drain region;
- a gate oxide film on a surface of said semiconductor substrate;
- gate electrodes disposed on said gate oxide film;
- a plurality of first offset regions of the same conductivity type as the drain regions and having a second impurity concentration level different from said first impurity concentration level of the drain regions, each first offset region being contiguous to an associated drain region and near said surface of said semiconductor substrate; and
- a plurality of LOCOS insulation films which are provided on said plurality of first offset regions.

2. A semiconductor device as claimed in claim 1, said FETs further comprising:
- a plurality of partial offset regions of the same conductivity type as said source regions and having a different impurity concentration than said source regions, each of said partial offset regions being provided in at least a part of said semiconductor substrate near said surface and interconnecting at least two adjacent source regions, each fo said partial offset regions extending only between adjacent source regions and being disposed only between adjacent drain regions; and
- a plurality of LOCOs insulation films which are provided on said plurality of partial offset regions.

3. A semiconductor device as claimed in claim 2, wherein said gate electrodes partially cover said LOCOS insulation films on said first offset regions, and cover said LOCOS insulation films on said partial offset regions.

4. A semiconductor device as claimed in claim 1 wherein the first offset regions have an impurity concentration level lower than that of the drain regions.

5. A semiconductor device as claimed in claim 2 wherein the partial offset regions have an impurity concentration level lower than that of the source regions.

* * * * *